US006724074B2

(12) United States Patent
Song et al.

(10) Patent No.: US 6,724,074 B2
(45) Date of Patent: Apr. 20, 2004

(54) STACK SEMICONDUCTOR CHIP PACKAGE AND LEAD FRAME

(75) Inventors: Young-Hee Song, Kyungki-do (KR); Hai-Jeong Sohn, Kyungki-do (KR); Ill-Heung Choi, Chungcheongnam-do (KR); Sung-Ho Hong, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/289,668

(22) Filed: Nov. 6, 2002

(65) Prior Publication Data

US 2003/0122239 A1 Jul. 3, 2003

(30) Foreign Application Priority Data

Dec. 27, 2001 (KR) ......................................... 2001-85924

(51) Int. Cl.[7] ............................................. H01L 23/495
(52) U.S. Cl. .................... 257/676; 257/777; 257/784
(58) Field of Search ................................. 257/666, 672, 257/676, 686, 735, 777, 779, 784

(56) References Cited

U.S. PATENT DOCUMENTS

| 5,917,242 A | * | 6/1999 | Ball | 257/737 |
| 6,566,739 B2 | * | 5/2003 | Moon | 257/668 |
| 6,646,334 B2 | * | 11/2003 | Hur | 257/686 |

FOREIGN PATENT DOCUMENTS

| JP | 11-054693 | 2/1999 |
| JP | 2000-156464 | 6/2000 |

OTHER PUBLICATIONS

English language abstract for Japanese Publication No. JP2000–156464.
English language abstract for Japanese Publication No. JP11–054693.

* cited by examiner

Primary Examiner—Long Pham
Assistant Examiner—Hoai Pham
(74) Attorney, Agent, or Firm—Marger Johnson & McCollom, P.C.

(57) ABSTRACT

A stack package has a lead frame and first and second stacked chips. The lead frame comprises first and second lead groups respectively corresponding to the first and second chips and a plurality of external connection terminals for electrically interconnecting the first and second chips to an external device. Each of the first and second chips has its own common and independent electrode pads, and each of the first and second lead groups has its own common and independent leads. The common leads and the common electrode pads are for address and control signals to and from the first and second chips, and the independent leads and the independent electrode pads are for data input and output to and from the first and second chips. The common leads of the first lead group and the common leads of the second lead group are commonly interconnected to be connected to an identical external connection terminal of the plurality of external connection terminals, and the independent leads of the first lead group and the independent leads of the second lead group are connected to different external connection terminal. The first and second chips are disposed symmetrically with respect to the common leads and face each other with their backsides. The stack package can be implemented by using two memory devices and two lead frames of LOC type and can increase two times the memory capacity and bit structure.

27 Claims, 6 Drawing Sheets

STACK SEMICONDUCTOR CHIP PACKAGE AND LEAD FRAME

RELATED APPLICATION

This application claims priority and benefit of Korean Patent Application No. 2001-0085924, filed on Dec. 27, 2001, the contents of which are incorporated herein by reference in their entirety.

BACKGROUND

This invention relates to semiconductor chip packaging technology, and more particularly to a stack chip package of high I/O pins and a lead frame suitable for such stack chip package.

Semiconductor integrated circuit (IC) chips may be assembled into package devices for mounting on circuit boards. Conventionally, the package device may use a media for electrical interconnection and physical support of the chip to the circuit board. A lead frame is a common media for such purposes.

In order to increase a density of packaged semiconductor devices, semiconductor IC chips may be mounted on both sides of a lead frame. Conventional packaged devices may employ a lead frame that comprises a die region and a number of conductive leads. The semiconductor IC chips may be physically bonded to the die region by an adhesive and may be electrically interconnected to the conductive leads by metal bond wires. The IC chips and bond wires may then be encapsulated and molded within an epoxy resin to form a package body to protect the chips from an external environment. Outer portions of the leads, i.e., the outer leads that protrude from the package body, may be bent or shaped to assist mounting to a circuit board.

Further developments in chip stacking technology have led to the use of two lead frames of central pad LOC (Lead-On-Chip) type for enhancing the mounting density of memory devices such as DRAMs. This package is a kind of DDP (Dual Die Package) and since a lead frame is used, a multi-wiring pattern structure cannot be used. Thus, more input and output terminals may be required than what might otherwise be available with tape or PCB (Printed Circuit Board) type packages. Additionally, design limitations may exist in implementing these types of devices for high bit structures.

Addressing such problems, some manufacturers have tried to modify the conventional package structures so that a PCB or tape style conductive wiring pattern may be attached to a lead frame. However, such modified structures have not been widely accepted in the industry because of difficulties associated with manufacturing these lead frames, increased cost and other technical limitations.

For instance, X32 structure devices such as 2MX32 and 4MX32 SRAMs may be produced by designing X32 chips incorporated with TSOP (86 pin I/O) or FBGA technology. Some manufacturers may produce X32 MCP package device by using two X16 chips and a substrate routing technique with PCB or tape. However, there have been no producers of a high-bit device (e.g., X32 device) incorporating two X16 chips with a lead frame.

SUMMARY OF THE INVENTION

An exemplary embodiment of the present invention may increase capacity of high bit memory devices by using a simple lead frame process absent additional PCB or tape.

Further exemplary embodiments may provide for methods of forming stack package devices of high capacity and multi-bit structures using conventional tools and may avoid the need for new equipment investments.

According to one embodiment of the present invention, a stack semiconductor chip package may comprise a lead frame coupled to first and second stacked chips. The lead frame may comprise first and second lead groups for coupling the respective first and second chips to external connection terminals. Each of the first and second chips may comprise their own common and independent electrode pads. Likewise, each of the first and second lead groups may comprise common and independent leads. The common leads and the common electrode pads may be associated with address and control signals. The independent leads and the independent electrode pads, on the other hand, may be associated with data signals. The common leads of the first lead group may be interconnected to respective common leads of the second lead group for propagation of same associated address or control signals. The commonly interconnected leads may be connected through respective ones of the external connection terminals for routing of their address and control signals. The independent leads of the first lead group and the independent leads of the second lead group may be connected separately and independently to different terminals of the plurality of external connection terminals. The first and second chips may be disposed back-to-back and in symmetrical relationship to each other when viewed with respect to the common leads.

In a particular exemplary embodiment of the present invention, two memory devices may be incorporated together with two LOC type lead frames. This stack package may assist increased memory capacity and bit structures. For example, two X16 memory devices may be stacked to provide a X32 package device. Each of the semiconductor chips may have common electrode pads of a mirrored relationship to each other. Additionally, at least some of the electrode pads of upper and lower chips of the stack may comprise sequential signal assignments of the same order within the package. In one embodiment, the mirrored arrangements of pads may be implemented by using alternative metal processes during fabrication of the electrode pads of the lower chip relative to the upper chip. In another embodiment, a wire bonding option may be used to provide for the arrangements of electrode pad structures for the upper and lower chips. In accordance with a further embodiment, the plurality of semiconductor chips within the stack are of the same function. In another embodiment, the chips comprise devices of different function.

According to another embodiment of the present invention, a stack semiconductor chip package may comprise a plurality of stacked semiconductor chips and a lead frame. The lead frame may comprise a plurality of lead groups that correspond to respective chips of the plurality of chips. A plurality of external connection terminals may electrically interconnect the chips to an external device. In a particular embodiment, the semiconductor chips are of central pad type with electrode pads disposed at the central regions of the active surfaces of the chips. The electrode pads may include common and independent electrode pads. The lead groups overlie and may be attached to the active surfaces of the respective chips. Each of the lead groups may comprise common and independent leads. The common leads and the common electrode pads may route address and control signals to and from the first and second semiconductor chips. The independent leads and the independent electrode pads may route data input and output signals to and from the first and second semiconductor chips. The respective common leads of the plurality of lead groups may be interconnected to each other and to associated identical external connection terminals of the plurality of external connection terminals. In a further aspect, the first and second semiconductor chips may be disposed back-to-back and in symmetrical relationship to each other relative to the common leads.

Exemplary embodiments of the present invention may enable formation of high-bit IC devices using tools of traditional lead frame technology.

These and other features and advantages will be more clearly understood from the following detailed description taken together with the accompanying drawings. It is important to point out that the illustrations may not necessarily be drawn to scale, and that there may be other embodiments of this invention which are not specifically illustrated.

DETAILED DESCRIPTION

Figure 1:
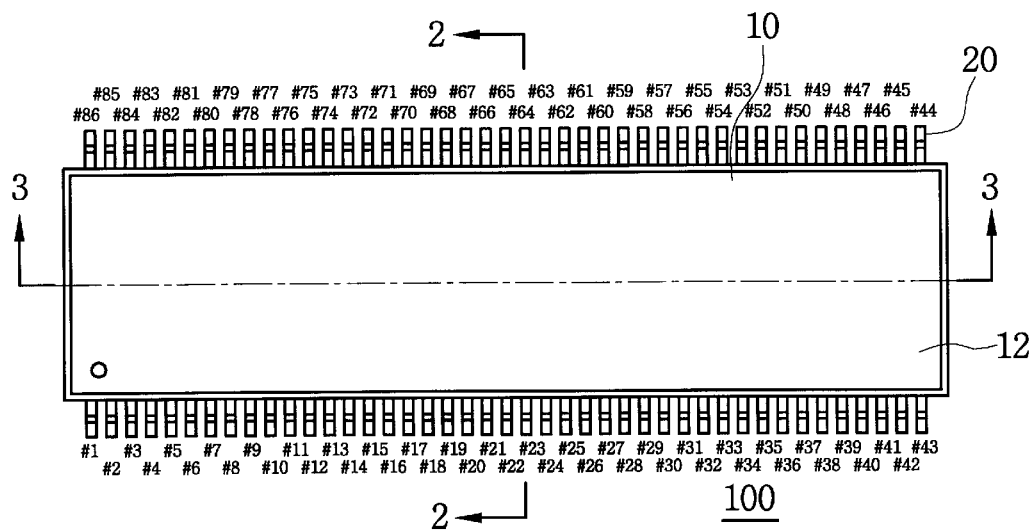
FIG. 1 is a plan view of a stack semiconductor chip package according to an embodiment of the present invention.
Figure 2:
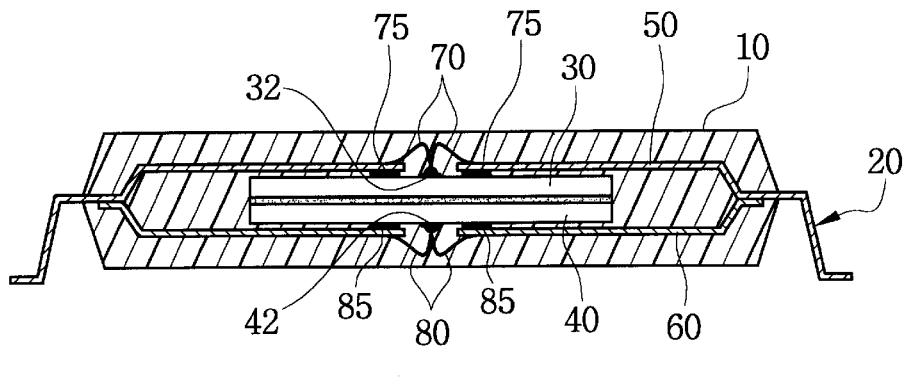
FIG. 2 is a cross-sectional view of the stack semiconductor chip package taken along line 2—2 in FIG. 1.
Figure 3:
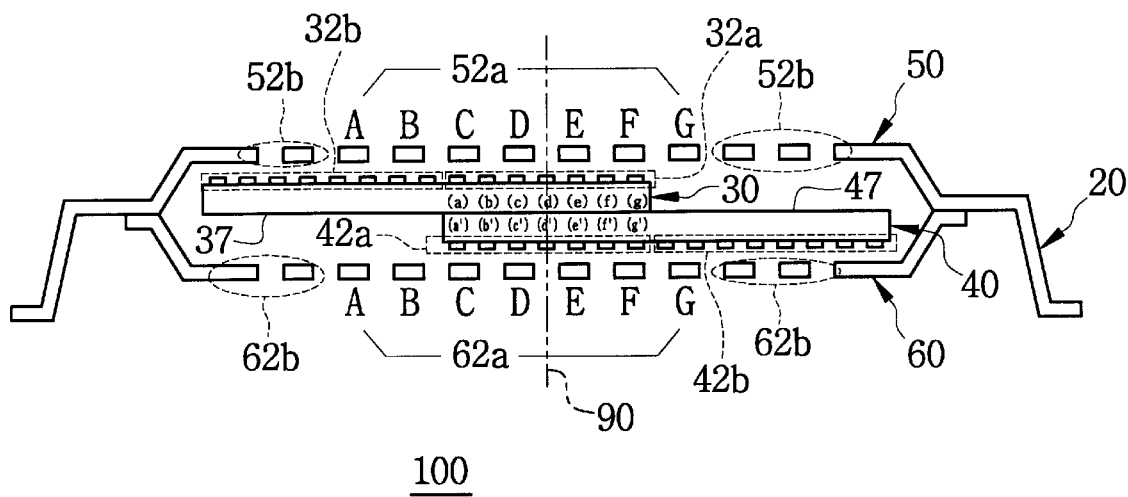
FIG. 3 is a cross-sectional view of the stack semiconductor chip package taken along line 3—3 in FIG. 1.

FIG. 1 is a plan view of a stack semiconductor chip package according to an embodiment of the present invention, and FIGS. 2 and 3 are cross-sectional views of a stack semiconductor chip package taken along lines 2—2 and 3—3 in FIG. 1, respectively. In this embodiment, stack package 100 may comprise an 86-pin package having eighty-six outer leads 20 protruding from package body 10. Outer leads 20 may allow electrical interconnection of a semiconductor IC chip within body 10 to external circuits (not shown). Package body 10 may comprise, e.g., a plastic body of EMC (Epoxy Molding Compound). Outer leads 20 may comprise, e.g., iron-alloy or copper-alloy. The leads may be bent to a shape (e.g., gull-wing shape) suitable for mounting the stack package 100 to an external device, e.g., a circuit board.

Referring to FIG. 2, stack package 100 may comprise a first semiconductor chip 30 and a second semiconductor chip 40. First chip 30 may be disposed at an upper position in the stack and hence may be called an 'upper semiconductor chip'. Likewise, second chip 40 may be disposed at a lower position in the stack and may therefore be referred to as a 'lower semiconductor chip'. In one embodiment, the upper and lower chips may comprise devices of same function and structure. In other embodiments, they may comprise devices of different function. It may be understood, however, that even when the upper and lower chips comprise devices of different functions, the two chips may have relevance to each other with reference to subsets of their pin structures and may, thus, be suitable devices for integration within a stack package. When the upper and lower chips are identical types of devices, stack package 100 may be referenced as a DDP package. Alternatively, when the upper and lower chips comprise different functional devices, stack package 100 may be referenced as a MCP (Multi-Chip Package).

Active surfaces of the upper and lower chips may be formed with a plurality of electrode pads 32 and 42, respectively. The upper and lower chips 30 and 40 may be mechanically supported and electrically connected by the lead frame of, e.g., iron alloy or copper alloy. The lead frame may comprise outer leads 20, first lead group 50 and second lead group 60. The first and second lead groups 50 and 60 may be encapsulated within package body 10 and may be called 'inner leads'.

First lead group 50 may be electrically connected to electrode pads 32 of upper chip 30 by metal wires 70. Likewise, second lead group 60 may be electrically connected to electrode pads 42 of lower chip 40 by metal wires 80. In this embodiment, metal wires 70, 80 electrically connect semiconductor chips 30 and 40 and lead groups 50 and 60. In another embodiment, metal bumps may electrically interconnect chips 30 and 40 to leads 50 and 60. The metal bumps (not shown) may be formed on each of electrode pads 32 and 42. For this embodiment the tips of leads 50 and 60 may be positioned and thermally compressed against the metal bumps.

With reference to FIG. 3, upper chip 30 may be interfaced by first lead group 50, while lower chip 40 may be interfaced by second lead group 60. In a specific embodiment, the first and second leads 50 and 60 lie on the active surfaces of their corresponding chips and may be electrically connected to their respective chip electrode pads 32 and 42 to implement, e.g., a LOC (Lead On Chip) structure. In this embodiment, the lead frame and chip interfacing may be referenced as LOC configurations.

It will be understood, however, that the scope of the present invention may encompass lead frame interfacing to the chip other than LOC. For example, in another embodiment upper and lower chips 30 and 40 may be attached to both sides of the die pad of a lead frame and the first and second lead groups may be disposed to depart from the die pad of a conventional type of lead frame. Further details of such other embodiment are omitted so as not to obscure the primary features of the exemplary embodiments of the present invention.

Returning with further reference to FIGS. 2–3, portions of lead groups 50 and 60 near the center of the active surfaces may be attached to the active surfaces by LOC tapes 75 and 85. As shown in the drawing, first lead group 50 is formed in one body region of the package and integral with outer leads 20. The second lead group 60 may be electrically interconnected to the first lead group 50 at locations near the outer wall of the package body 10. The electrical interconnection of the first and second lead groups 50 and 60 can be formed by conventional methods, e.g., soldering, compression bonding, reflow, etc.

Figure 4:
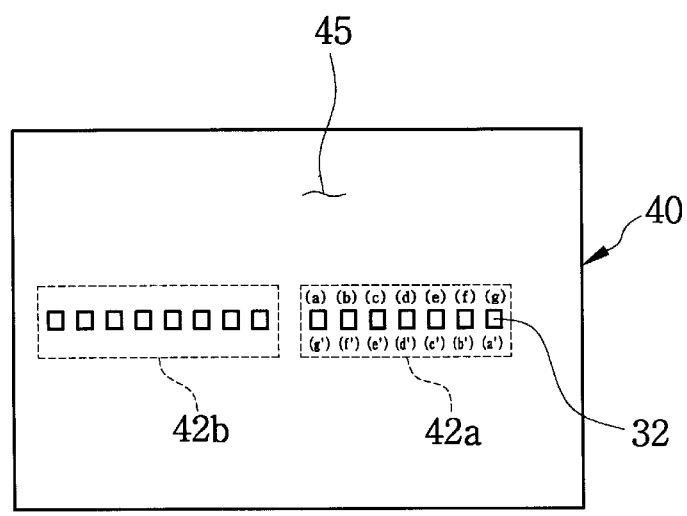
FIG. 4 is a plan view of a semiconductor chip having an electrode pad structure suitable for use in a stack package of an embodiment of the present invention.

Referring to FIG. 4, in a particular embodiment, the upper and lower semiconductor chips 30 and 40 may comprise types with central pad where electrode pads 32 and 42 may be disposed at centers of active surfaces 35 and 45, respectively of the chips. However, it is understood that alternative embodiments may use chips having peripheral pads where electrode pads 32 and 42 may be arranged along the periphery of the active surfaces. The structure of such peripheral type package is not further described herein.

Each of the upper and lower chips 30 and 40 may comprise their own common electrode pads 32a and 42a and independent electrode pads 32b and 42b. Common electrode pads 32a of upper chip 30 may be interfaced by corresponding common leads 52a of first lead group 50, while independent electrode pads 32b may be interfaced by independent leads 52b of first lead group 50. Similarly, common electrode pads 42a of lower chip 40 may be interfaced by corresponding common leads 62a of second lead group 60, and independent electrode pads 42b may be interfaced by corresponding independent leads 62b of second lead group 60.

Common electrode pads 32a and 42a and common leads 52a and 62a may be used to route address signals and control signals to and from each of the upper and lower chips 30 and 40. Independent electrode pads 32b and 42b and independent leads 52b and 62b may be used to route data signals to and from each of the upper and lower chips 30 and 40. Power signals for chips 30 and 40 may also be routed via the common leads. In this context, the term 'common' may reference a common interconnection of electrode pads and leads to the upper and lower chips 30 and 40 for sharing same respective ones of signals as may be routed via their common interconnection to outer leads 20. In contrast, the term 'independent' may reference independent or separate interconnection of the electrode pads or leads for each of the upper and lower chips 30 and 40 to separate respective terminals of outer leads 20.

Further referencing FIG. 3, common electrode pads 32a and 42a may be formed on respective active surfaces 35 and 45 of upper and lower chips 30, 40 respectively. These common pads of the respective upper and lower chips may be arranged to provide similar order of signal assignments within the package as shown in FIG. 3. For example, if the upper and lower chips 30 and 40 are formed with electrode pads of mirrored relationship to one another, then when the chips of mirrored pad arrangements are attached together through their back sides, the common pads 32a and 42a of the upper and lower chips may comprise signal assignments that are of similar order within the package. These embodiments comprising the common electrode pads of the same order within the package may be obtained in a variety of ways, including at least one of three different methods explained below.

First, as shown in FIG. 4, common electrode pads 42a of a lower chip 40 may initially be deemed with pad structure the same as the upper chip. For instance, when the common electrode pads 32a of upper chip 30 are arranged in the order of (a) (b) (c) (d) (e) (f) (g), if a lower chip of the same pad structure were used, the common electrode pads 42a of the lower chip 40 would become (g') (f') (e') (d)' (c') (b') (a'). However, in this embodiment of the present invention, the arrangement of the common electrode pads 42a of the lower chip 40 may be changed, e.g., by a metal option process during fabrication. During such fabrication of the lower chip, the common pads may be wired for signal assignments of mirrored structure relative to the common electrode pads of the upper chip. Specifically, in this embodiment, the common pads of the lower chip may be formed with an order of (a') (b') (c') (d') (e') (f') (g'). By modifying the order of common electrode pads, it may be easier to interconnect the common leads 52a and 62a (FIG. 3) for the common electrode pads to corresponding shared ones of the outer leads.

Figure 5:
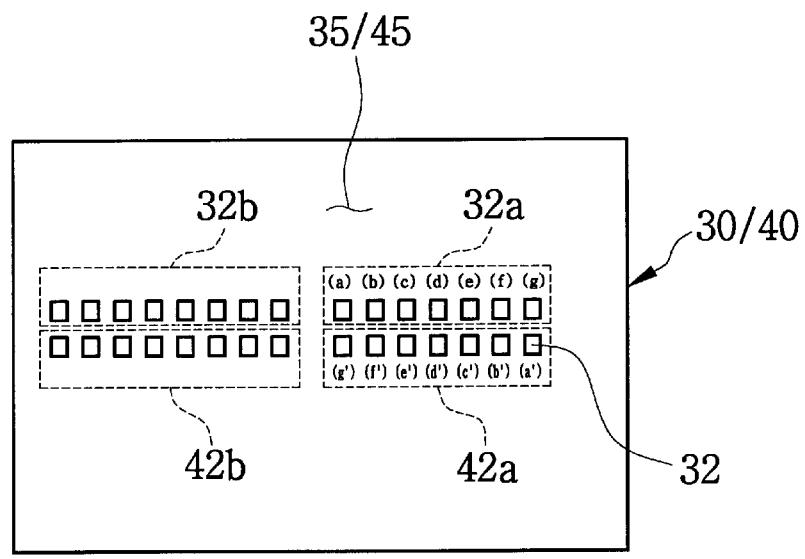
FIG. 5 is a plan view of a semiconductor chip having another electrode pad structure suitable for use in a stack package of an embodiment of the present invention.

On the other hand, in accordance with another embodiment as shown in FIG. 5, both sets of the electrode pads 32a and 32b may be formed for the upper chip 30 and similar sets of electrode pads 42a and 42b may be formed for the lower chip 40 on the active surface thereof. When such chip is used for an upper chip 30, electrode pads 32a and 32b may be electrically connected to corresponding leads via metal wires. Alternatively, if the chip is to be used for the lower chip, electrode pads 42a and 42b may be connected to the leads by metal wires. This embodiment can be viewed as employing a wire bonding option, in comparison to the metal option of the previous embodiment, to bring-about the alternative mirrored pad arrangements.

Figure 6:
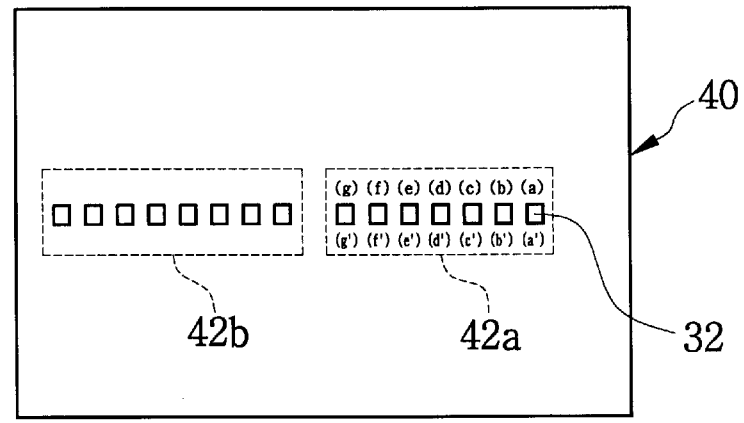
FIG. 6 is a plan view of a semiconductor chip having an electrode pad structure suitable for use in the stack package in accordance with yet another embodiment of the present invention.

Finally, as shown in FIG. 6, a dedicated chip having an electrode pad arrangement suitable for lower chip 40 may be fabricated, so that the common electrode pads of the upper and lower semiconductor chips may be disposed in the same order within the package body. In this embodiment, electrode pads 42a of lower chip 40 may mirror the structure of pads 32a of the upper chip 30 and may be used in assembly processes without changing the pad arrangement.

In this embodiment of the stack chip package device, the upper and lower chips 30 and 40 may be attached back-to-back, i.e., with their active surfaces facing outwardly. For instance, active surface 35 of upper chip 30 may face upwardly in FIGS. 2 and 3, while active surface 45 of lower chip 40 may face downwardly. With reference to center line '90' of FIG. 3, upper chip 30 is disposed with its majority on a left side of the centerline while lower chip 40 may be disposed with its majority on the right side of the center line. These offsets of chips 30 and 40 may allow the common electrode pads 32a and 42a to be positioned at substantially same positions along the longitudinal length of the package body.

Figure 7:
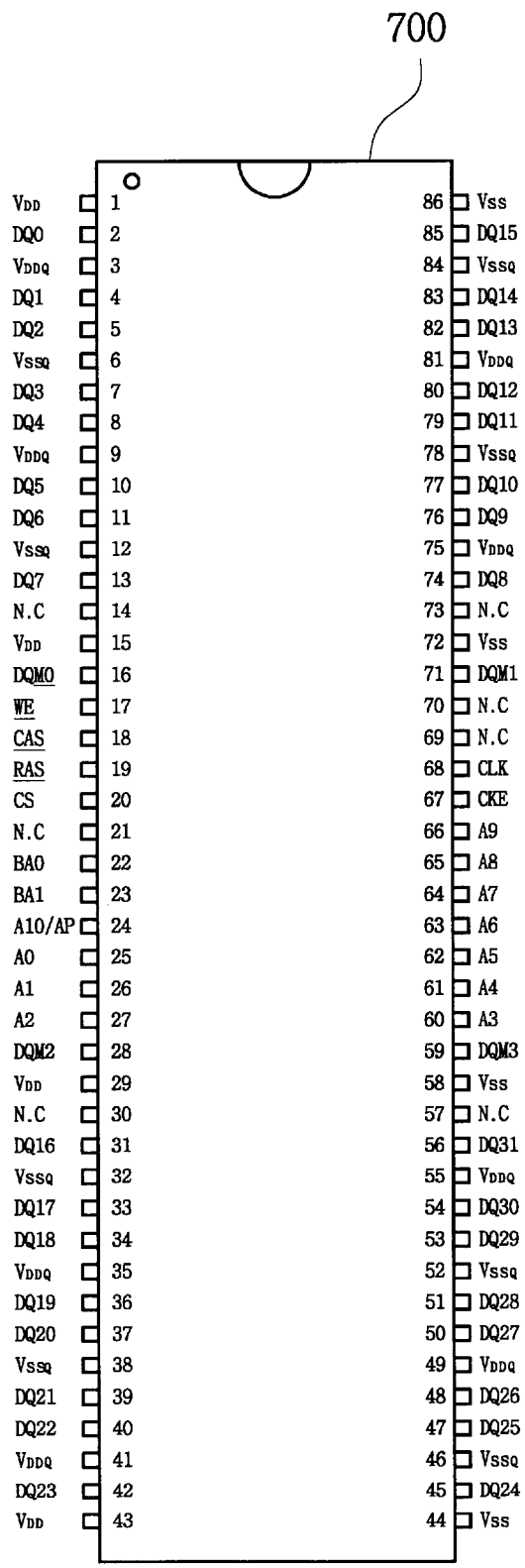
FIG. 7 is a plan view of a stack package showing multiple pins according to one specific exemplary embodiment of the present invention.

FIG. 7 is a plan view of a device 700 which may be manufactured in accordance with an exemplary embodiment of the present invention for the formation of, e.g., an 86 pin synchronous DRAM device of a TSOP (400 mil×875 mil) structure and pin pitch of 0.5 mm.

Further referencing the example of FIG. 7, leads 17–27 and 60–70 may be identified as a group of common leads and other leads may be identified as independent leads. The common leads may be used for routing of address signals and control signals such as, e.g., WE/(write enable), CAS/(column address strobe), RAS/(row address strobe), CS/(chip select), BA0-1 (bank select address), A0-9 (address), CKE (clock enable), and CLK (system clock). The independent leads may be used for routing of power and input/output data such as, e.g., DQM0-3 (data input/output mask), DQO-31 (data input/output), $V_{DD}/V_{SS}$ (power supply/ground), and $V_{DDQ}/V_{SSQ}$ (data output power/ground). The independent leads may be disposed on opposite sides of the common leads. In this embodiment, the leads for data signals DQ0-15 may be disposed on one end of the chip on one side of the common leads, and the leads for the data signals DQ16-31 may be disposed on the other end of the chip. This means that independent leads for data signals DQ0-15 may be connected exclusively to upper chip 30, while those of data signals DQ16-30 may be connected to lower chip 40. Accordingly, two semiconductor chips, e.g., X16 SDRAM, may be stacked in accordance with this exemplary embodiment to produce a X32 SDRAM stack package device. In this example, power signals have been routed along independent leads. In alternative embodiments, common leads may be used to route at least some of the power signals.

Figure 8:
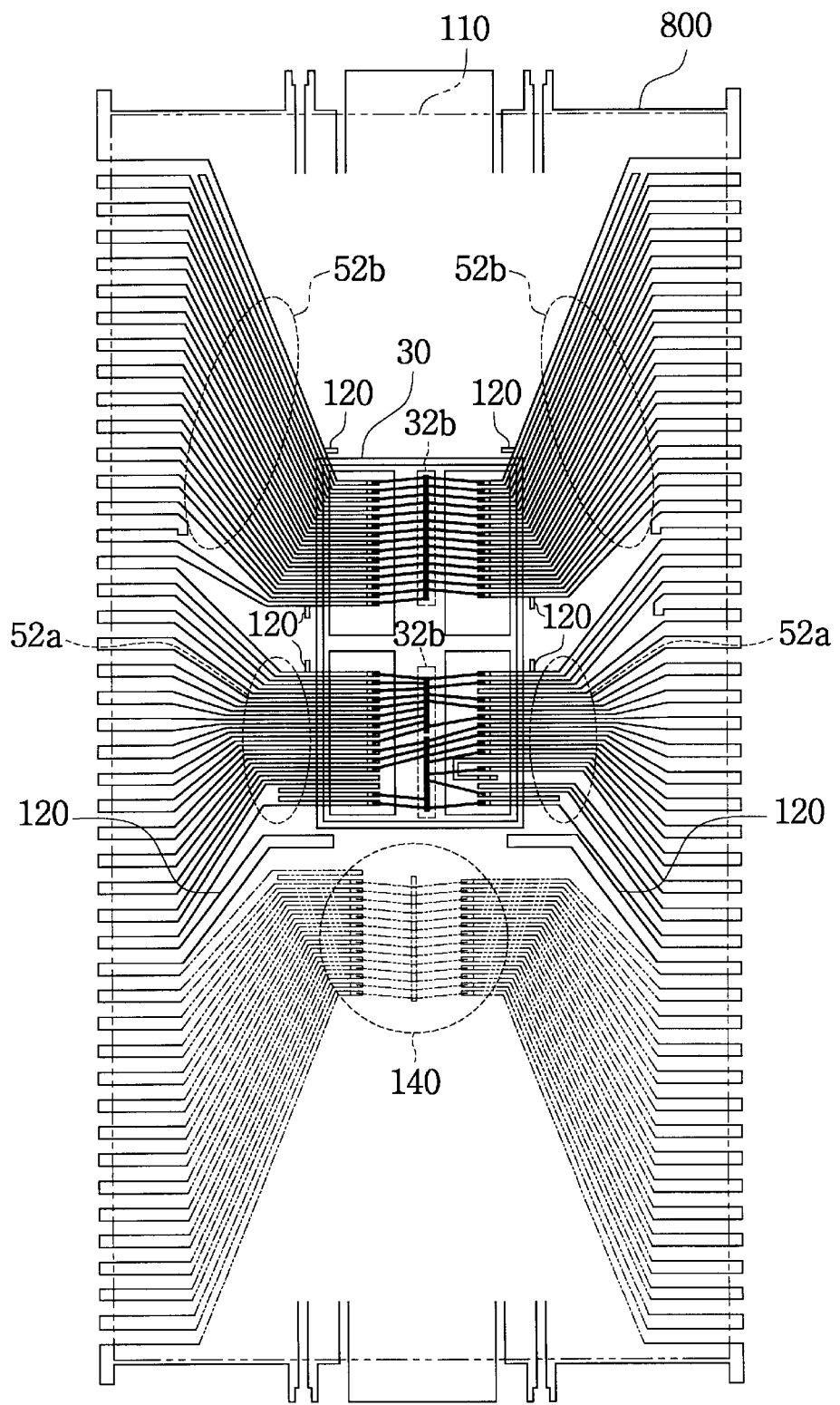
FIG. 8 is a partial planar simplified view showing a structure of an upper lead frame in a stack package according to an embodiment of the present invention.
Figure 9:
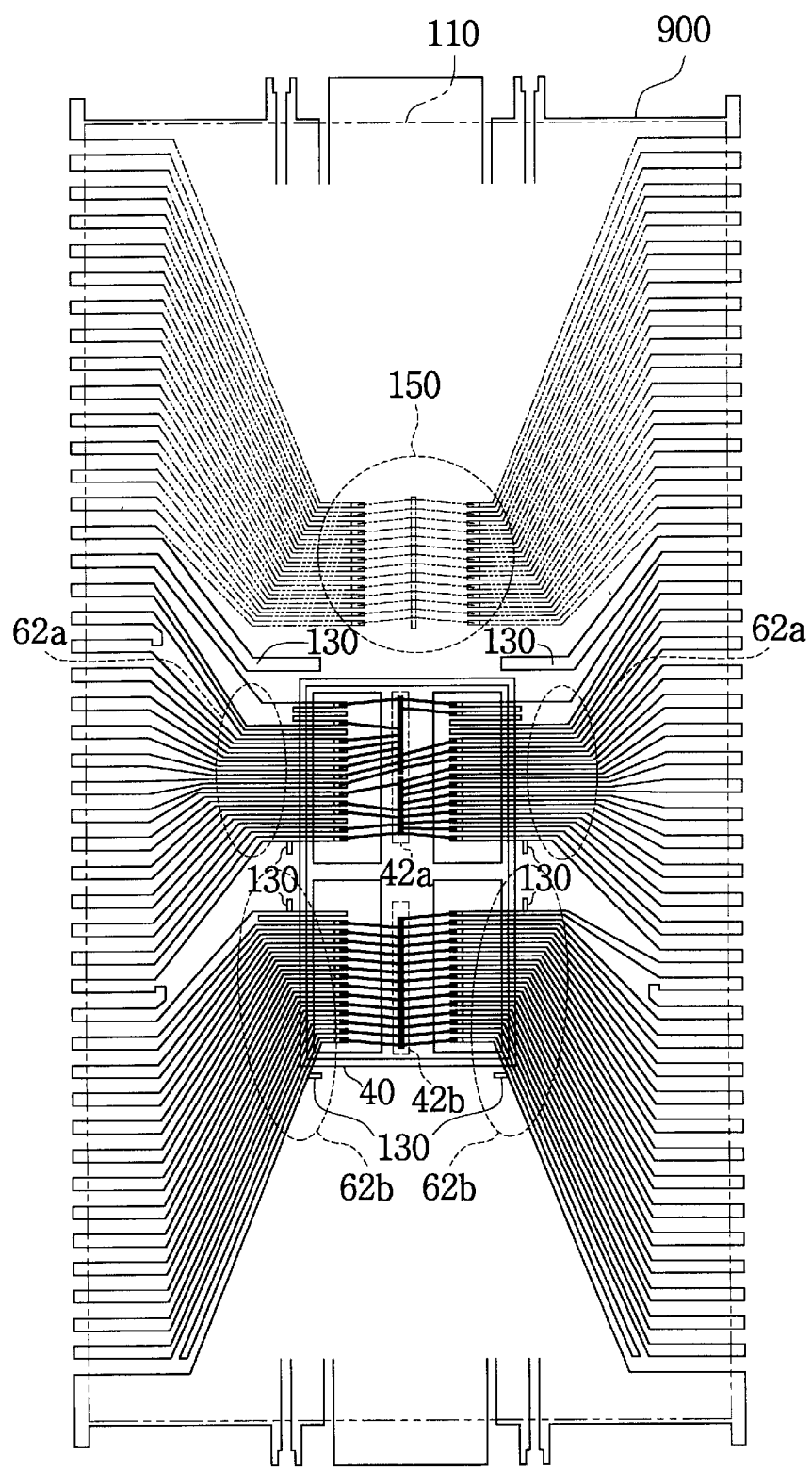
FIG. 9 is a partial planar simplified view showing a structure of a lower lead frame in a stack package according to an embodiment of the present invention.

FIGS. 8 and 9 are simplified plan views for showing upper and lower lead frames that may be used for electrically interfacing upper and lower semiconductor chips 30 and 40 according to exemplary embodiments of the present invention.

Referring to FIGS. 8 and 9, the upper and lower lead frames 800, 900 may comprise respective common leads 52*a* and 62*a*. Independent leads 52*b* of upper lead frame 800 and independent leads 62*b* of lower lead frame 900 may be arranged in symmetrical relationship about the common leads 52*a* and 62*a*. In accordance with a further embodiment, dummy leads 140 may be formed with the upper lead frame and with a structure similar to independent leads 62*b* of the lower lead frame. Alternatively, the upper lead frame may omit these dummy leads as shown by the dotted lines in FIG. 8. Similarly, dummy leads 150 may be formed with the lower lead frame and with a structure the same as independent leads 52*b* of the upper lead frame. Alternatively, the dummy leads may be omitted as shown by the dotted lines in FIG. 9. The formation of the dummy leads may depend on the molding process that may be used to form a resin package body (of outline 110).

A high-pin stack package device according to an embodiment of the present invention may have symmetrical offsets (per a side view of the package body) of the upper and lower chips into respective left and right side regions of the package structure. In this embodiment molding precautions may guard against void formation during the epoxy injection and molding for the package body. Moreover, the upper and lower chips may be kept aligned during the die bonding process and when attaching them together with parts of their backsides. In a particular embodiment, the chips may be aligned with alignment keys 120 and 130 in predetermined positions of the upper and lower lead frames.

According to exemplary embodiments of the present invention, a high-bit memory device of high capacity can be obtained using a lead frame approach, without need for additional PCB or tape. Further, such high-bit stack package device of a lead frame, realization may be implemented without need for extensive additional processing steps or equipment investments that might otherwise be required with PCB or tape processes.

In the drawings and specification, there have been disclosed typical embodiments of this invention and, although specific terms are employed, they may be used in a generic and descriptive sense only and not for purposes of limitation. It will be understood that the scope of the present invention shall be set forth in the following claims.

What is claimed is:

1. A stack semiconductor chip package comprising:

a first semiconductor chip;

a second semiconductor chip comprising a backside that faces a backside of the first semiconductor chip;

a lead frame to electrically interface the first and second semiconductor chips to external connection terminals for coupling to an external device;

the lead frame comprising first and second lead groups, the first lead group to interface the first semiconductor chip and the second lead group to interface the second semiconductor chip;

each of the first and second semiconductor chips comprising common and independent electrode pads;

each of the first and second lead groups comprising common and independent leads, the common leads and the common electrode pads to route address and control signals, and the independent leads and the independent electrode pads to route data signals;

at least one of the common leads of the first lead group and at least one of the common leads of the second lead group interconnected to route a shared signal through a common terminal of the plurality of external connection terminals;

the independent leads of the first lead group and the independent leads of the second lead group to route separate signals through separate respective terminals of the external connection terminals; and the first and second semiconductor chips disposed in substantially symmetrical relationship to one another with respect to the common leads.

2. The stack package of claim 1, the common electrode pads of the first semiconductor chip disposed in the same order, within and along a given axis of the package, relative to the common electrode pads of the second semiconductor chip.

3. The stack package of claim 2, the first semiconductor chip disposed as an upper chip over the second semiconductor chip as the lower chip, the common electrode pads of the lower chip per its front-face view comprising an arrangement that mirrors that of the common electrode pads of the upper chip per its front-face view.

4. The stack package of claim 3, the common electrode pads of mirrored relationship formed by a metal option process.

5. The stack package of claim 1, the backside of the first semiconductor chip attached to the backside of the second semiconductor chip, and each of the first and second semiconductor chips comprising active surfaces with their electrode pads facing outwardly.

6. The stack package of claim 1, in which the first lead group lies on and is attached to an active surface of the first semiconductor chip and the second lead group lies on and is attached to an active surface of the second semiconductor chip.

7. The stack package of claim 6, in which each of the first and second semiconductor chips comprises an active surface and their electrode pads are disposed in a central region of the active surface.

8. The stack package of claim 1, further comprising metal wires electrically interconnecting the first and second lead groups to their respective first and second semiconductor chips.

9. The stack package of claim 1, further comprising metal bumps electrically interconnecting the first and second lead groups to the respective first and second semiconductor chips.

10. The stack package of claim 1, in which the first lead group further comprises dummy leads of structure corresponding to the independent leads of the second lead group, the dummy leads disposed at positions corresponding to the independent leads of the second lead group.

11. The stack package of claim 10, in which the second lead group further comprises dummy leads of structure corresponding to the independent leads of the first lead group, the dummy leads disposed at positions corresponding to the independent leads of the first lead group.

12. The stack package of claim 1, in which the first and second semiconductor chips comprise X16 memory devices and the package forms an X32 device.

13. The stack package of claim 1, at least some of the common leads of the first and second lead groups to route power supply signals to the first and second semiconductor chips.

14. The stack package of claim 1, in which the first and second semiconductor chips are of identical function and structure.

15. The stack package of claim 1, in which the first and second semiconductor chips are of different function.

16. A stack semiconductor chip package comprising:
a plurality of stacked semiconductor chips; and
a lead frame;
the lead frame comprising:
a plurality of lead groups, each lead group of the plurality to interface a respective one of the semiconductor chips, and
a plurality of external connection terminals for electrically interconnecting an external device;
each of the plurality of semiconductor chips comprising:
an active surface, and
electrode pads on and within a central region of the active surface;
each lead group of the plurality of lead groups attached to the active surface of its associated semiconductor chip, each of the lead groups comprising common and independent leads;
the common leads and the common electrode pads to route address and control signals for the semiconductor chips;
the independent leads and the independent electrode pads to route data signals for the semiconductor chips;
at least one common lead of each of the respective lead groups interconnected to an identical external connection terminal of the plurality of external connection terminals;
opposite facing semiconductor chips of the plurality of stacked semiconductor chips disposed in substantially symmetrical relationship to each other relative to the common leads.

17. The stack package of claim 16, in which the electrode pads of at least one of the plurality of semiconductor chips per its front face view comprises common electrode pads that mirror electrode pads of an opposite facing semiconductor chip of the plurality per its front face view.

18. The stack package of claim 16, in which each of the plurality of semiconductor chips comprises:
a first arrangement of electrode pads of the plurality of electrode pads, the first arrangement for associated assembly within the chip stack package; and
a second arrangement of electrode pads as an alternative to the first arrangement, the second arrangement for different package assembly.

19. The stack package of claim 16, in which the plurality of semiconductor chips comprise X16 memory devices and the stack package comprises a pin-out arrangement to a X32 device.

20. A lead frame to interface at least first and second semiconductor chips in a semiconductor stack package, the lead frame comprising:
a first lead group to interface the first chip;
a second lead group to interface the second chip; and
a plurality of outer leads to electrically connect the first and second chips to an external device;
the first and second lead groups comprising common leads to route address signals and control signals to and from the first and second chips;
the first and second lead groups further comprising independent leads to route data signals to and from the first and second chips;
the independent leads of the first lead group and the independent leads of the second lead group disposed in symmetric relationship to each other about the common leads of the first and second lead groups.

21. The lead frame of claim 20, in which the first lead group comprises dummy leads at positions corresponding to the independent leads of the second lead group.

22. The lead frame of claim 21, in which the second lead group comprises dummy leads at positions corresponding to the independent leads of the first lead group.

23. The lead frame of claim 20, in which the first lead group comprises shortened leads at positions corresponding to the independent leads of the second lead group and the second lead group comprises shortened leads at positions corresponding to the independent leads of the first lead group.

24. The lead frame of claim 20, in which respective ones of the common leads of the first and second lead groups are connected to each other and connect to share identical outer leads of the plurality of outer leads.

25. The lead frame of claim 20, in which the first and second lead groups comprise leads to electrically interface the plurality of semiconductor chips and mechanically support the semiconductor chips.

26. The lead frame of claim 20, in which the leads comprise at least one of a copper alloy and an iron alloy.

27. A semiconductor device comprising:
a first semiconductor chip;
a second semiconductor chip over the first semiconductor chip; and
a lead frame to electrically interface the first and second semiconductor chips to an external device;
the lead frame comprising:
a first group of leads to connect electrode pads of the first semiconductor chip, and
a second group of leads to connect electrode pads of the second semiconductor chip;
the first group comprising common leads to route address and control signals between the first semiconductor chip and the external device;
the second group comprising common leads to route address and control signals between the second semiconductor chip and the external device;
at least one of the common leads of the first group and a respective one of the common leads of the second group interconnected for coupling to a common external connection terminal;
the first group further comprising independent leads to route data to and from the first semiconductor chip; and
the second group further comprising independent leads to route data to and from the second semiconductor chip;
the independent leads of the first group separate from the independent leads of the second group.

* * * * *